US009232315B2

(12) United States Patent
Martin et al.

(10) Patent No.: US 9,232,315 B2
(45) Date of Patent: Jan. 5, 2016

(54) MONOLITHICALLY APPLIED HEATING ELEMENTS ON SAW SUBSTRATE

(75) Inventors: Tom A. Martin, Canton, CT (US); Pierre A. Dufilie, Vernon, CT (US); Joseph V. Adler, New Milford, CT (US)

(73) Assignee: Phonon Corporation, Simsbury, CT (US)

( * ) Notice: Subject to any disclaimer, the term of this patent is extended or adjusted under 35 U.S.C. 154(b) by 1252 days.

(21) Appl. No.: 13/065,177

(22) Filed: Mar. 16, 2011

(65) Prior Publication Data

US 2012/0234818 A1 Sep. 20, 2012

(51) Int. Cl.

| | |
|---|---|
| ***H05B 1/00*** | (2006.01) |
| ***H05B 3/00*** | (2006.01) |
| ***H05B 11/00*** | (2006.01) |
| ***H01L 41/22*** | (2013.01) |
| ***H04R 17/00*** | (2006.01) |
| ***G01M 1/14*** | (2006.01) |
| ***G01N 29/00*** | (2006.01) |
| ***G01V 13/00*** | (2006.01) |
| ***G01P 15/08*** | (2006.01) |
| ***G01P 15/13*** | (2006.01) |

(52) U.S. Cl.

CPC .......... *H04R 17/00* (2013.01); *H04R 2201/003* (2013.01); *Y10T 29/42* (2015.01)

(58) Field of Classification Search

CPC .. H04R 17/00; H04R 2201/003; G07C 5/008; G07C 5/0808; H03H 9/08; H03H 3/02; H03L 1/04; G05D 23/241; B41J 2/1623

USPC .................. 219/210; 29/25.35; 73/1.82, 1.83, 73/514.28

See application file for complete search history.

(56) References Cited

U.S. PATENT DOCUMENTS

| | | | | |
|---|---|---|---|---|
| 3,809,931 A | | 5/1974 | White et al. | 310/8.1 |
| 3,916,348 A | | 10/1975 | Toda et al. | 333/30 R |
| 3,943,389 A | | 3/1976 | Hickernell et al. | 310/9.5 |
| 3,965,444 A | | 6/1976 | Willingham et al. | 333/30 R |
| 4,037,176 A | | 7/1977 | Ono et al. | 333/30 R |
| 4,110,653 A | | 8/1978 | Hartemann | 310/313 |
| 4,166,228 A | | 8/1979 | Solie | 310/313 |
| 4,516,049 A | | 5/1985 | Mikoshiba et al. | 310/313 A |
| 4,609,843 A | | 9/1986 | Carr et al. | 310/313 A |
| 4,661,738 A | | 4/1987 | Skeie | 310/313 D |
| 4,726,225 A | * | 2/1988 | Brace et al. | 73/204.23 |
| 4,766,411 A | | 8/1988 | Prieto et al. | 338/306 |

(Continued)

OTHER PUBLICATIONS

"Ovenized and Thermally Tunable Aluminum Nitride Microresonators" (Kim et al.) Presented as paper 1OE-5 at the IEEE Ultrasonics Symposium in Oct. 2010.

(Continued)

*Primary Examiner* — Dana Ross
*Assistant Examiner* — Lindsey C Teaters
(74) *Attorney, Agent, or Firm* — Alix, Yale & Ristas, LLP

(57) ABSTRACT

A surface acoustic wave (SAW) device comprising a piezoelectric substrate having a working surface with an active zone capable of propagating an acoustic wave on said working surface; at least one interdigital transducer on the working surface, having interdigital fingers aligned in the active zone for inducing or receiving surface acoustic waves in the active zone; and a heating element on the working surface; wherein the transducer, heating element and preferably a temperature sensor are monolithically formed on the substrate.

26 Claims, 15 Drawing Sheets

(56) References Cited

U.S. PATENT DOCUMENTS

| | | | | |
|---|---|---|---|---|
| 5,048,336 | A | 9/1991 | Sugihara et al. | 73/336.5 |
| 5,896,259 | A | 4/1999 | Farwell et al. | 361/78 |
| 5,992,215 | A * | 11/1999 | Caron et al. | 73/24.01 |
| 6,018,211 | A | 1/2000 | Kanaboshi et al. | 310/313 R |
| 6,049,155 | A | 4/2000 | Graebner et al. | 310/313 R |
| 6,285,114 | B1 | 9/2001 | Sawin | 310/313 R |
| 6,351,194 | B2 | 2/2002 | Takahashi et al. | 333/133 |
| 6,955,787 | B1 | 10/2005 | Hanson | 422/50 |
| 7,134,319 | B2 | 11/2006 | Liu | 73/31.06 |
| 7,399,280 | B2 | 7/2008 | Liu et al. | 600/504 |
| 7,608,789 | B2 | 10/2009 | Krüger et al. | 174/521 |
| 7,696,675 | B2 | 4/2010 | Kanna | 310/361 |
| 7,701,113 | B2 | 4/2010 | Kido et al. | 310/313 R |
| 7,701,114 | B2 | 4/2010 | Nishiyama et al. | 310/313 A |
| 7,800,281 | B1 * | 9/2010 | Grama et al. | 310/313 D |
| 2006/0272416 | A1 * | 12/2006 | Liu et al. | 73/592 |
| 2008/0055022 | A1 * | 3/2008 | Koehnke et al. | 333/193 |

OTHER PUBLICATIONS

"New Design of Low Profile Precision OCXO . . . " (S.V. Anastasyev) presented as paper 59810346 at the IEEE Frequency Control Symposium (1998).

"Surface Acoustic Wave Flow Sensor" (Nisar Ahmad, Research Engineer, Electronics Technology Center, Rexnord Corporate R&I, Milwaukee, WI) Presented as paper 0090-5607/85/0000-0483 IEEE in 1985 Ultrasonics Symposium pp. 483-485.

* cited by examiner

MONOLITHICALLY APPLIED HEATING ELEMENTS ON SAW SUBSTRATE

BACKGROUND

The present invention relates to temperature compensated surface acoustic wave (SAW) devices.

SAW devices utilize the localized propagation of acoustic waves on the surface of a planar piezoelectric substrate. SAW transduction between electrical signals and acoustic waves is accomplished by thin film metallic interdigital electrodes on the substrate surface. SAW propagation velocity is temperature sensitive, but SAW devices must often work over a wide temperature range, so devices may be mounted in a custom oven to maintain a fixed temperature above the maximum ambient temperature.

An oven comprises a device holder, heater, temperature sensor, feedback temperature controller, thermal insulation, and electrical connections between the device and ambient. An oven contains (and is thus larger than) the ovenized device and consumes significant power.

One example of an attempt to provide more efficient temperature compensation for a SAW device, is described in U.S. Publication 200810055022A1. The SAW substrate is contained within a vacuum housing which in turn is within a packaging, and a heater is located on the housing or the bottom of the SAW substrate, opposite the acoustic propagation surface. Although a distinct oven around the packaging is avoided, the heater is still remote from the propagation surface of the SAW substrate.

SUMMARY

Our invention heats and preferably temperature senses only the localized surface where the surface acoustic waves actually exist.

The heater and preferably associated temperature sensor are realized as thin film metallic meander resistor electrodes on the substrate propagation surface, which can be deposited monolithically with the transducers and other functional features from the same photomask and photolithographic manufacturing process.

In one embodiment, the present disclosure is directed to a surface SAW device comprising a substrate having a working surface with an active zone capable of propagating an acoustic wave on the working surface, at least one interdigital transducer on the working surface, and a heating element on the working surface, adjacent to at least the active zone, wherein the transducer and heating element have the same material composition.

Preferably, the working surface is substantially rectilinear with opposite input and output ends and opposite sides, one transducer is an input transducer adjacent the input end and another transducer is an output transducer adjacent the output end, and each transducer has an electrically conductive path on the working surface, defining respective leads having the same composition as and deposited monolithically with the transducers and heating elements. The active zone includes the metal strips (interdigital fingers) comprising the input and output transducers and the area between the input and output transducers, and the heating elements are situated along side margins of the substrate between the active zone and each side of the working surface.

Preferably, a temperature sensor is also deposited monolithically with the transducers, heating elements and other features on at least one of the substrate working surface side margins between a respective heating element and a side of the working surface.

A method embodiment is directed to fabricating a surface acoustic wave device with a heating element, wherein the improvement comprises forming a heating element on the working surface, adjacent to at least the active zone, in a monolithic step with the transducer and other conductive paths.

The monolithic step preferably comprises applying a layer of imageable material to the working surface of the substrate, imaging the material to simultaneously form positive or negative latent images of the transducer, conductive path and heating element, and developing the latent image to simultaneously define the transducer, conductive path and heating element.

Practitioners in this field will readily recognize that the preferred embodiment of the innovation disclosed herein

- reduces oven volume, which aids miniaturization
- reduces heated surface area, which reduces oven power
- reduces heated volume, which reduces warm-up time
- senses device temperature at the optimum location, which minimizes the thermal time constant between the acoustic region and the sensor, which improves temperature stability
- increases circuit integration, which simplifies construction and reduces cost
- is applicable to a broad range SAW filters, including resonator filters

BRIEF DESCRIPTION OF THE DRAWING

Various embodiments are depicted in the accompanying drawing, in which.

DETAILED DESCRIPTION

Figure 1:
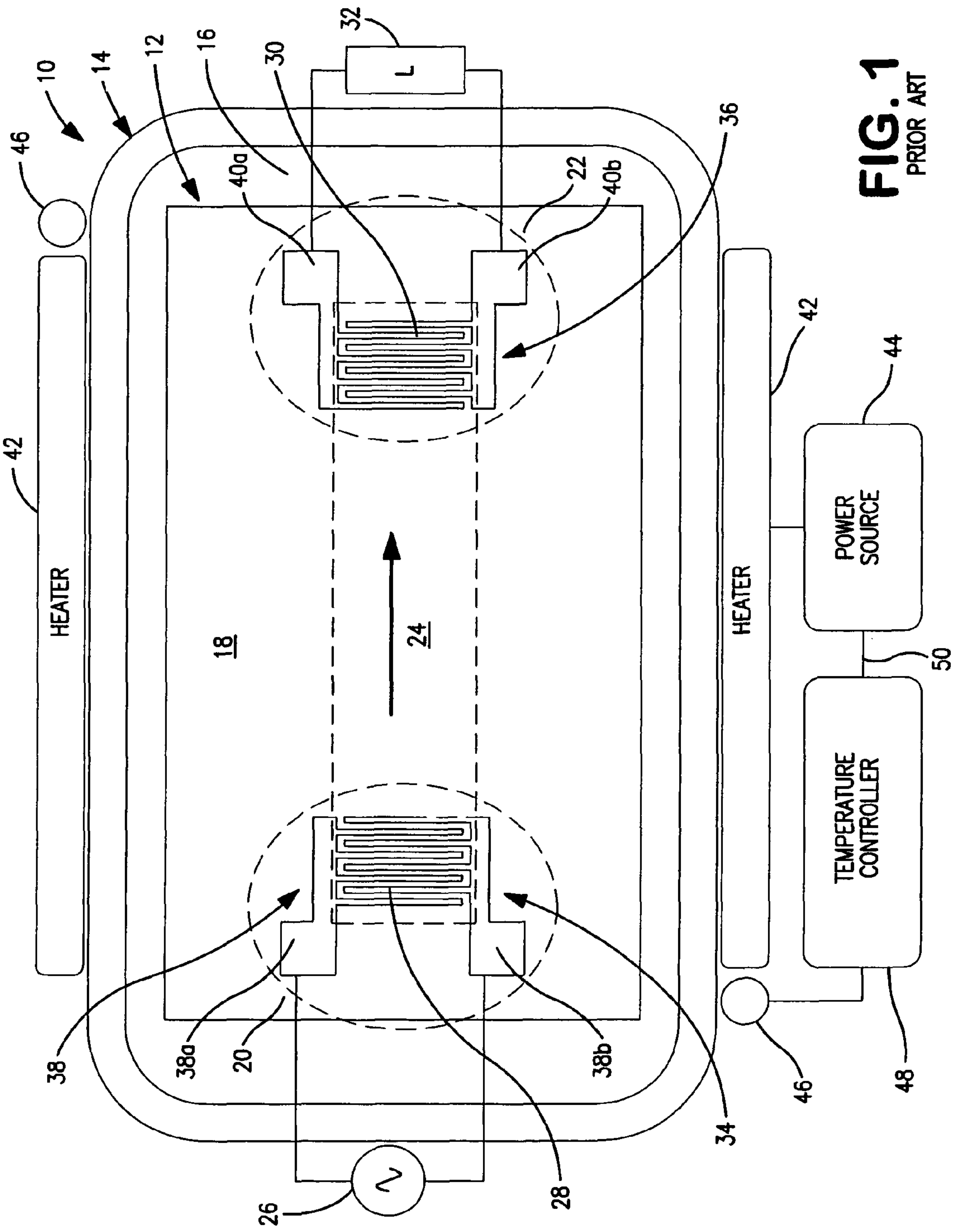
FIG. 1 PRIOR ART
FIG. 1 is a schematic of a conventional SAW band pass filter in a case with temperature control.

FIG. 1 represents a conventional band pass SAW filter 10 comprising a piezo electric crystal substrate 12 encapsulated by casing 14 with intervening air gap 16. The working surface 18 of the substrate is capable of transmitting acoustic surface waves, which are induced by input electric-to-mechanical transducer 20 and received by output mechanical-to-electric transducer 22. The transducers 20, 22 are aligned with an axis of the crystalline structure of substrate 12, such that the transducer waveforms travel along such axis on an active zone 24 of the working surface 18.

A source 26 of electrical input signal is delivered to a plurality of electrically conductive interdigital transducer fingers 28, which by means of a piezo electric effect, generate an acoustic wave response on the active zone 24 according to the designed filter wavelength frequency selectivity. The filtered mechanical signal is picked up by the interdigital fingers 30 of the of the output transducer 22, and delivered to load 32. Generally, the wire leads of the source 26 and load 32 are connected to respective bus conductors 34, 36 at enlarged pads 38, 40. The fingers 28, 30 buses 34, 36 and pads 38, 40 are typically formed on the working surface monolithically 18 by any of a variety of well-known lithographic processes.

It is well known that the acoustic propagation in the active zone 24 is temperature dependent. Typically, a so-called "oven" is provided to maintain the crystal 12 at a constant temperature above the highest ambient temperature for which the SAW device is rated. In FIG. 1, the oven is provided by a plurality of heater elements 42 on the outside surface of the casing 14. The heat must pass through the air space 16 where temperature gradients in the casing are reduced such that the hot air in contact with the lateral surfaces of the crystal 12 is of substantially uniform temperature. A source of power 44 is connected to the heating elements 42, and temperatures sensors 46 and associated controller 48 provide a control heater control signal 50 to the power source 44.

Figure 2:
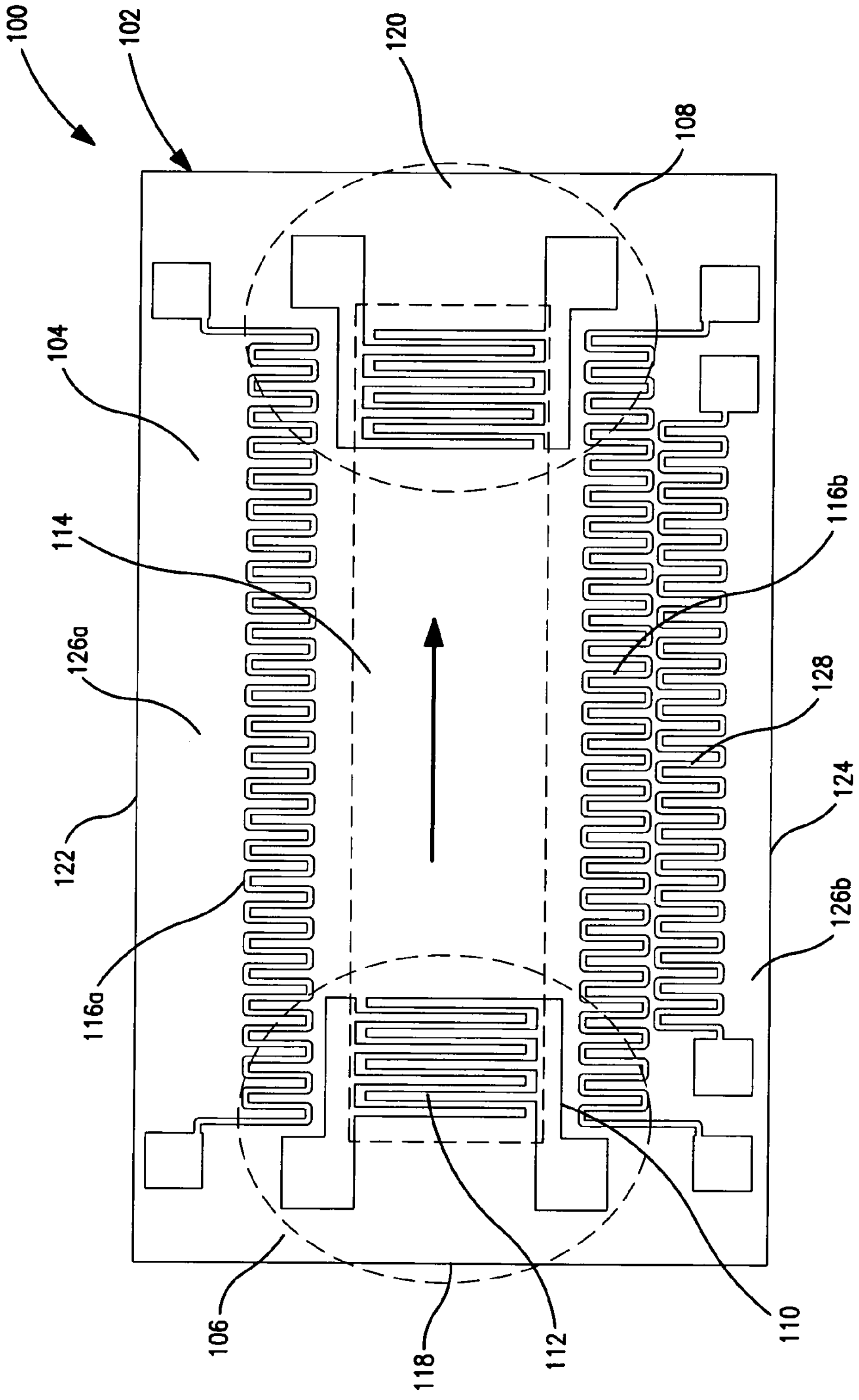
FIG. 2 is a schematic of the main operative portion of a SAW band pass filter incorporating one embodiment of the present invention.

FIG. 2 shows one embodiment 100 of the present invention as implemented in a band pass filter of the type show in FIG. 1. The piezo electric crystal 102 has substantially the same working surface 104, input transducer 106, output transducer 108, buses (represented at 110), interdigital fingers (represented at 112) and active zone 114 (represented by a dashed rectangle) as described with respect to FIG. 1. The most significant difference is that the heating elements 116A, B are provided on the working surface 104. In FIG. 2 (likewise FIG. 1) the working surface 104 is substantially rectilinear with opposite input and output ends 118, 120 and opposite sides 122,124. The transducers 106, 108 are adjacent the input and output ends 118, 120, with the active zone 114 situated between and including the transducers 106, 108. The heating elements 116A and 116B can be situated along side margins 126A and 126B of the working surface 104, between the active zone 114 and the sides 122, 124 of the working surface 104 of the substrate 102. Importantly, the heating elements 116 are in a much more intimate relationship with the active zone 114 than is possible with conventional ovens.

The temperature sensor 128 is likewise in a more intimate relationship with the active zone. In FIG. 2, the sensor 128 is on the side margin 126B of the working surface, between the heating element 116B and the side 124 of the working surface 104, but as will be described below, a plurality of sensor are preferably situated between the heating elements and the active zone.

In a further preference, the heating elements 116 are formed monolithically with at least the transducers 106, 108. The term "monolithic" when used herein should be understood as in the field of semi-conductor technology, i.e., formed on a single crystal substrate. Multiple photolithographic steps can be used. In the preferred construction the heaters, sensors, and resonator/filter pattern can be added to the substrate in a single photolithographic step (lowest cost). Multiple steps can be used if the required parameters (e.g., heater resistance) cannot be obtained in one step. This can still be considered monolithic. Thus, "monolithic" does not include a so-called "hybrid" feature that was formed outside the substrate and then attached to the substrate.

The heating elements 116 preferably comprise at least one group of thin film metallic meander resistor electrodes. Similarly, the temperature sensor 128 of FIG. 2 comprises at least one differently formed group of thin film metallic meander resistor electrodes.

Many metals can be used for the heater, transducers, and temperature sensor elements, based for example on guidance from Kirt R. Williams et al, "Etch Rates for Micromachining Processing—Part II", Journal of Microelectromechanical Systems, Vol 12, No 6, December 2003, pp 761-778. Additional photolithogtraphic steps can be used to add additional metal to bonding pads and electrical interconnects if necessary. In the following representative list, the order of metallic layers begins with the layer in contact with the substrate, and chemical symbols will be used. Sub will denote the surface of the substrate, e.g., Sub-Ti—Cu—Al corresponds to Ti on the substrate (Sub), Cu on top of the Ti layer, and Al on top of the Cu layer. Also, metal alloys may be substituted for pure metals, e.g., Al with 0.5% to 4% Cu or Si can replace pure Al.

- Sub-Al
- Sub-Cr—Al where Cr is an adhesion layer (10 to 300 angstroms)
- Sub-Ti—Cu—Al where Ti is an adhesion layer and Al is a barrier layer to oxide growth
- Sub-Ti—Pt where Ti is an adhesion layer which may also be Zr or Ir
- Sub-Ti—Pt—Au where Ti is an adhesion layer which may also be Zr or Ir
- Sub-Cr—Au where Cr is an adhesion layer which may also be Ta or Ti
- Sub-Cr—Ni where Cr is an adhesion layer
- Sub-Ta
- Sub-Cr—Pt where Cr is an adhesion layer
- Sub-Ti—W The above list is not exhaustive. The materials used for the transducers are chosen to obtain good SAW device characteristics. Material composition for the heater elements can be the same as for the transducers. If multiple processing steps are used then metal combinations with Ta or Pt or W or Ni/Cr alloy are preferable. Material composition for the temperature sensor can be the same as for the transducers. If multiple processing steps are used then metal combinations with Ta or Pt or W or Ni/Cr alloy are preferable.

In a very cost-effective embodiment, all of the transducers 106, 108 heater elements 116, and sensor 128 have the same material composition, preferably but not exclusively selected from the list consisting of

- Aluminum (500 to 10,000 Angstroms) with or without a chrome flash (typically 10-100 Angstroms) for adhesion
- Copper doped (0.5 to 4%) Aluminum with or without a chrome flash Silicon doped (0.5 to 4%) aluminum with or without a chrome flash Titanium-Platinum-Gold In the most cost effective embodiment, the transducers, heater elements and sensor not only have the same material composition, but are formed on the substrate simultaneously with the same process steps.

Figure 3:
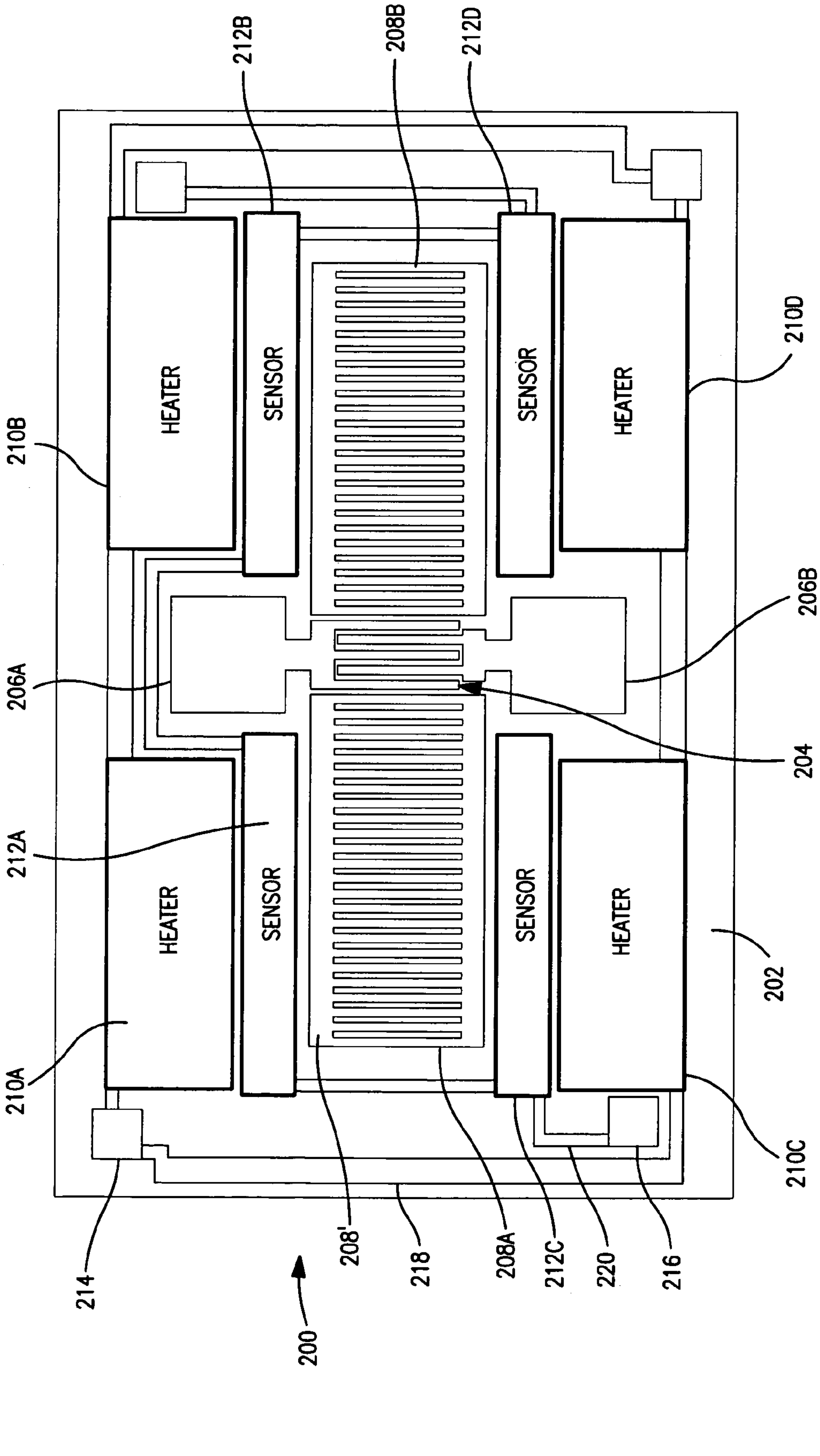
FIG. 3 is a schematic of the main operative portion of a one port SAW resonator with monolithic heater and temperature sensor according to another embodiment of the present invention.

FIG. 3 is a schematic of the main operative portion of a one-port SAW resonator 200 with monolithic heater and temperature sensor according to another embodiment of the invention. The substrate 202 has a central transducer 204 formed thereon, with alternating fingers, some of which are connected to bus 206A and the others connected to bus 206B. A first reflector grating 208A is situated on one side of the transducer 204, and another reflector grating 208B is situated on the other side of the transducer 204. A plurality of heaters 210A, B, C, and D, are on the working surface between the gratings 208A, 208B and the edges of the substrate. A plurality of temperature sensors 212 A, B, C, and D are located on the working surface, respectively between each heater 210 A, B, C, and D, and the boundary (such as 208') of each of the reflector gratings. At least one bond pad 214 is provided for the heaters, and at least one bond pad 216 is provided for the sensors. It should be appreciated that a bond pad can be shared, e.g., one sensor pad may be shared with one transducer bus. Conductive pads 218 between one or more heaters and conductive pads 220 between one or more sensors can be provided in a known manner.

The transducer 204, heaters 210, and sensors 212 and preferably the respective transducer buses 206, bond pads 214 for the heaters, and bond pads 216 for the sensors, are all monolithic with the substrate 202. The location of the heaters 214 on the substrate close to the grating 208 provides a substantially uniform temperature at the active zone, and the location of the sensors 212 on the substrate 212 immediately adjacent to the grating 208 provides a more accurate measure of the temperature in the active zone. Furthermore, a plurality of sensors with an associated plurality of heaters, coupled to a control system that compares the outputs of four sensors, can be used to adjust the current differential to each heater for achieving uniformity in the temperature of the active zone.

Figure 4:
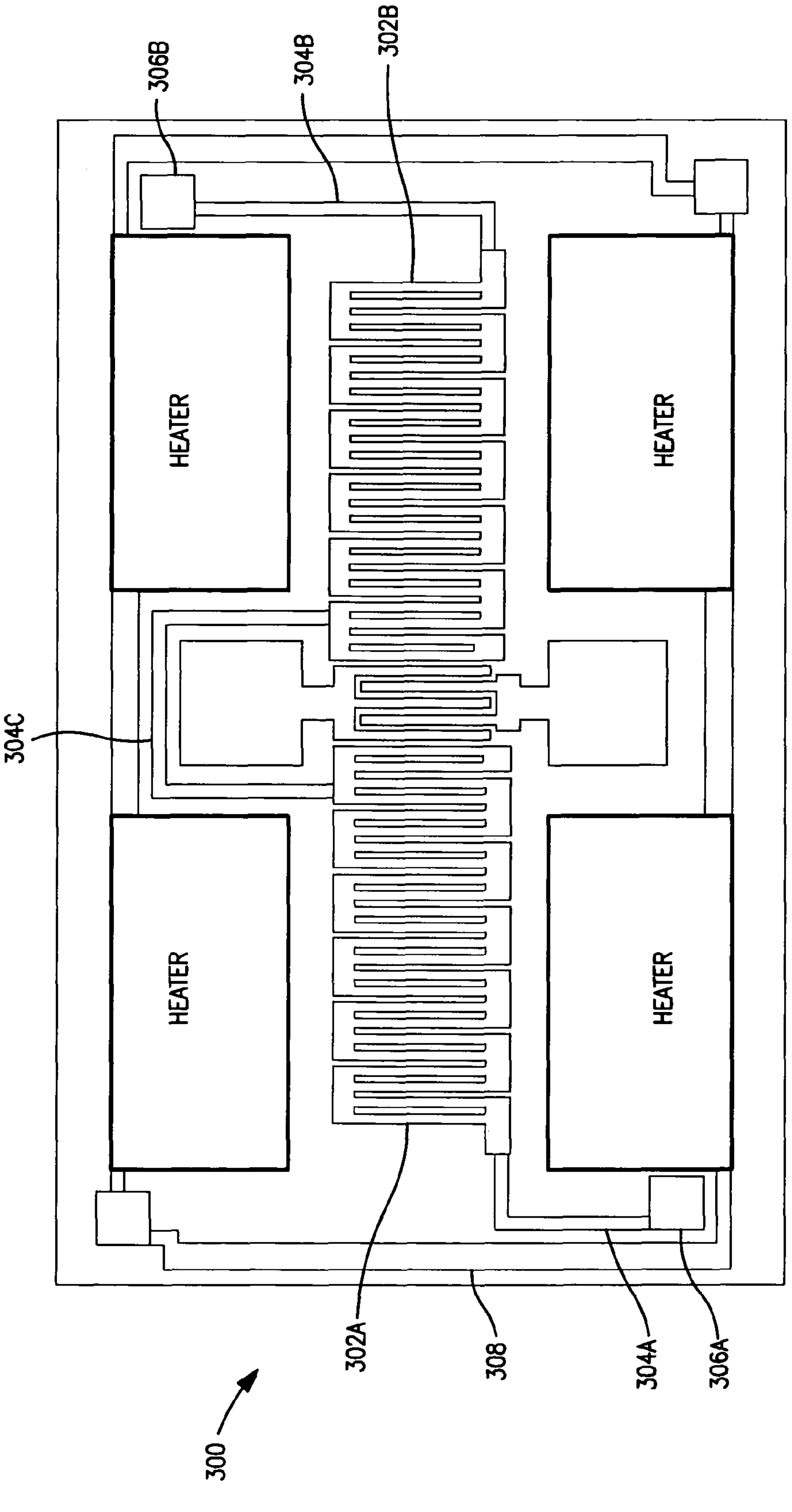
FIG. 4 is a schematic of a one-port SAW resonator with monolithic heater, and temperature sensors in the grating.

FIG. 4 shows a one-port SAW resonator 300 with monolithic heaters, and temperature sensor gratings. The monolithic gratings provide the dual functions of acoustic reflector for the resonator and temperature sensor. The resonator of FIG. 4 is similar to that of FIG. 3 except that the grating 302A, 302B is formed in a meander pattern of groups of two strips which are effective to produce the desired resonator output. In a further difference from FIG. 3, there is no temperature sensor outside the active zone, but rather conductive paths 304A, 304B, and 304C lead from the ends of the grating meander groups to respective bond pads 306 A, B for temperature measuring devices. Similarly, conductive paths 308 connect the heaters. The variations in the acoustic performance of the grating 302 is manifested at the bond pads 306 which are connected to a control system which can adjust the heater power to compensate for the effect of ambient temperature on the resonator performance.

With the meander sensor in the grating, it is preferable that the strips are grouped in integer multiples of a wavelength (e.g., 2, 4, 6, . . . for strips with a lambda/2 period). The reason is that the strip period is close to lambda/2 for a typical grating. Electrical boundary conditions affect the acoustic characteristics of the strips. A meander consisting of a single strip group will have a non-zero electrical impedance to the adjacent strip. This non-zero impedance will result in an additional component of acoustic reflection of the strip which in turn modifies the acoustic properties of the grating. This effect is minimized by grouping pairs of strips.

For gratings which include floating electrodes as in FEUDT structures, the meander connections only connect the electrodes which are not floating.

Figure 5:
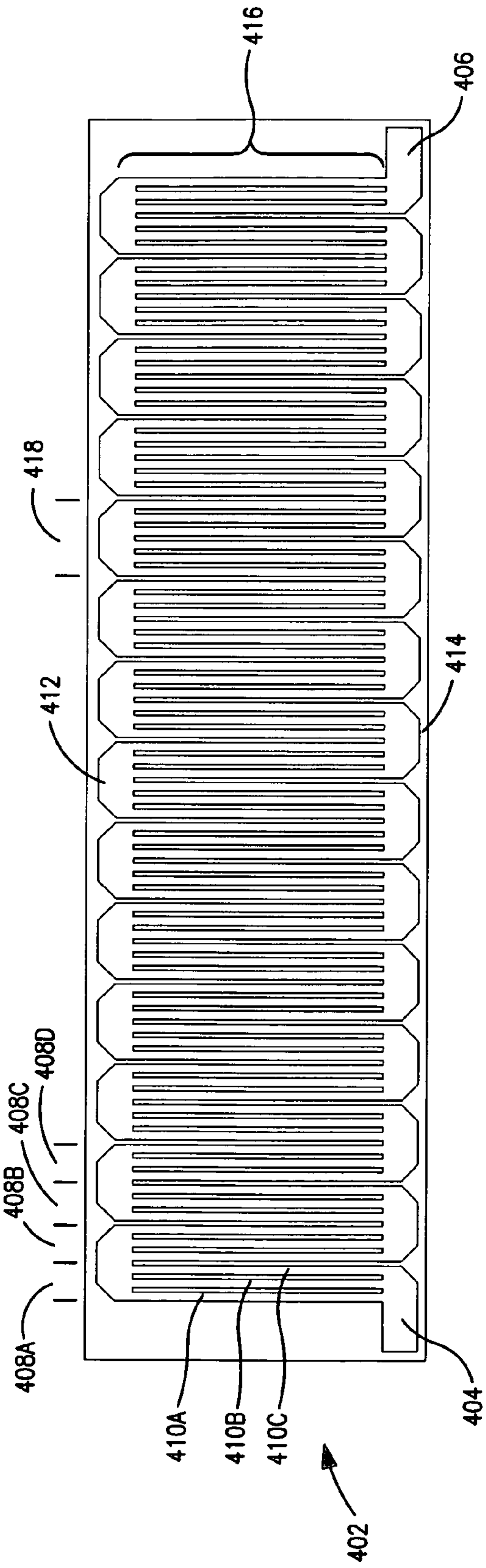
FIG. 5 is a detailed schematic of a heater element comprising a meander of a group of three strips.

FIG. 5 shows one configuration of a heater element consisting of a meander of groups of three resister strips. The heater has an input end 404 and an output end 406 with each group such as 408, 409, and 410 having three individual strips such as 410A, 410B, 410C associated with group 408A. This grouping alternates between upper and lower node portions such as 412 and 414. In the embodiment of FIG. 5, the thickness and spacing (period) of each strip 410 is the same; the width 416 of each group is the same; and the periodic spacing 418 between nodes is the same, as well as each group having three strips.

Figure 6:
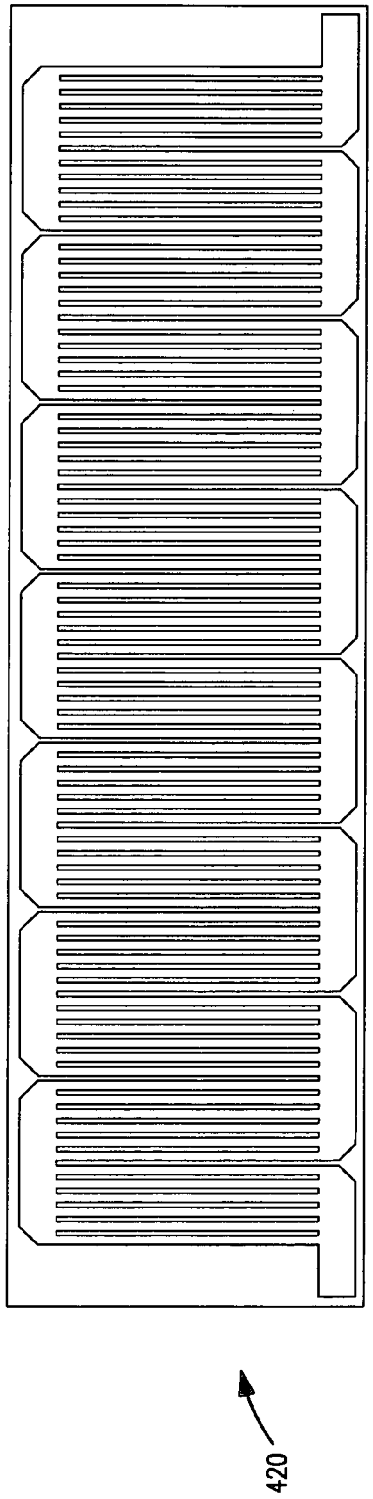
FIG. 6 is a detailed schematic of a heater element comprising a meander of a group of six strips.

The heater element 420 shown in FIG. 6 consists of a meander of groups of six strips, but is otherwise similar to the heater element of FIG. 5. It can thus be appreciated that the total heater resistance in a given surface area on the substrate can be changed by selecting a different number of strips per group. The widths and periods of the heater strips are comparable to those of a transducer on the SAW device, which similarity promotes very good fabrication control.

Figure 7:
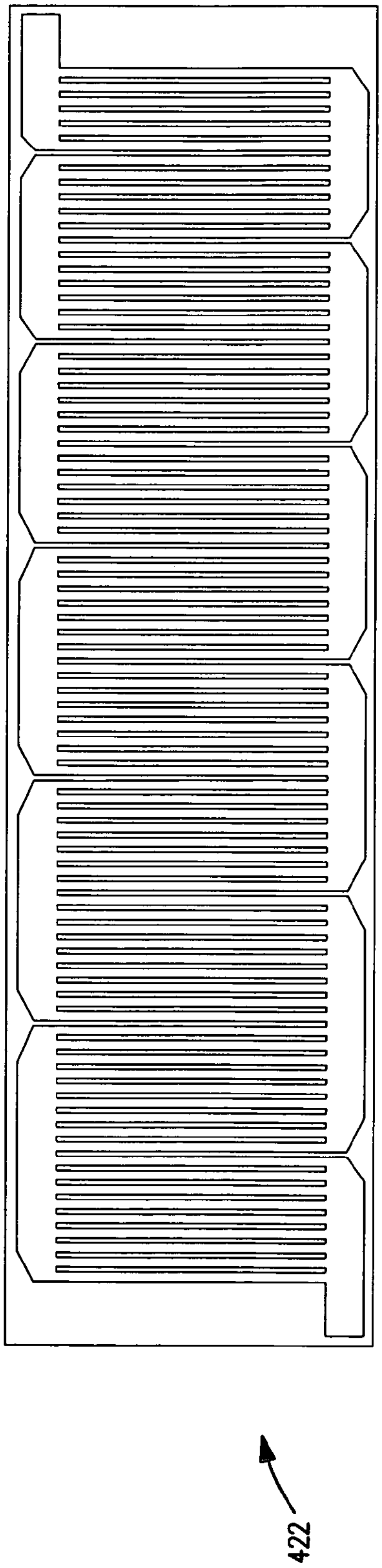
FIGS. 7 and 8 are schematics showing how spatial control of the power density can be implemented by varying the number of strips in the meander groups.
Figure 8:
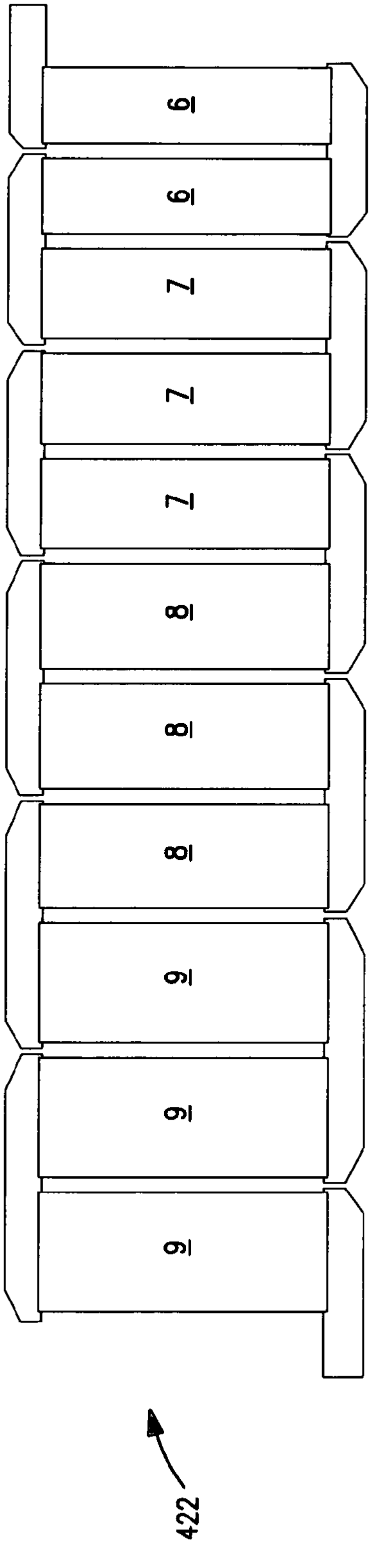

In yet a further variation 422 shown in FIGS. 7 and 8, spatial control of power density in the heater can be refined by employing a non-uniform number of strips per group. In FIGS. 7 and 8, the first three groups have nine strips each, the second three groups have eight strips each, the third three groups have seven strips each, and the last two groups has six strips each. The power density is proportional to $1/N^2$, where N equals the number of strips in the group.

Figure 9:
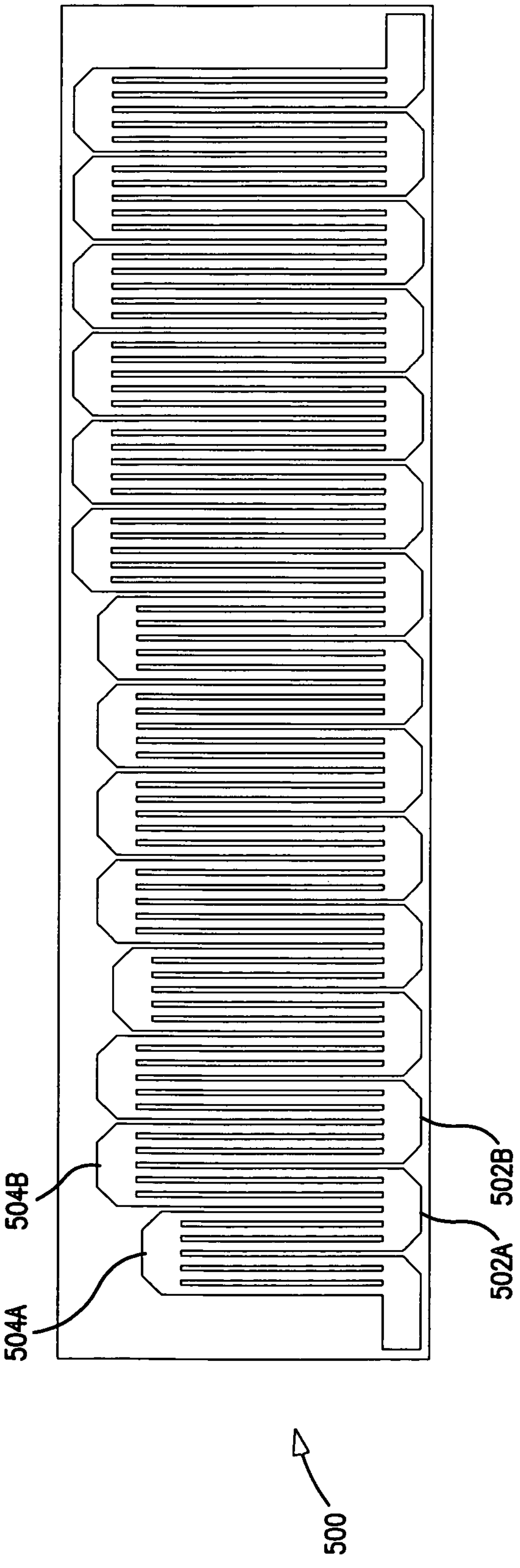
FIG. 9 is a schematic showing an alternative configuration for spatial control of power in the heater.

FIG. 9 illustrates a different approach to the spatial control of power in the heater. In this embodiment 500, each group has the same number of strips, but the length of strips in a given group can be modified to change the dissipated power in that group and thereby obtain a spatial control of the heater. The power is proportional to the length of the strips. Preferably, one set of nodes 502A, 502B, etc. fall on a substantially straight line, which would be closer to the active zone on the substrate, with all of the length variations accommodated at the opposite nodes such as 504A, 504B, etc.

Figure 10A:
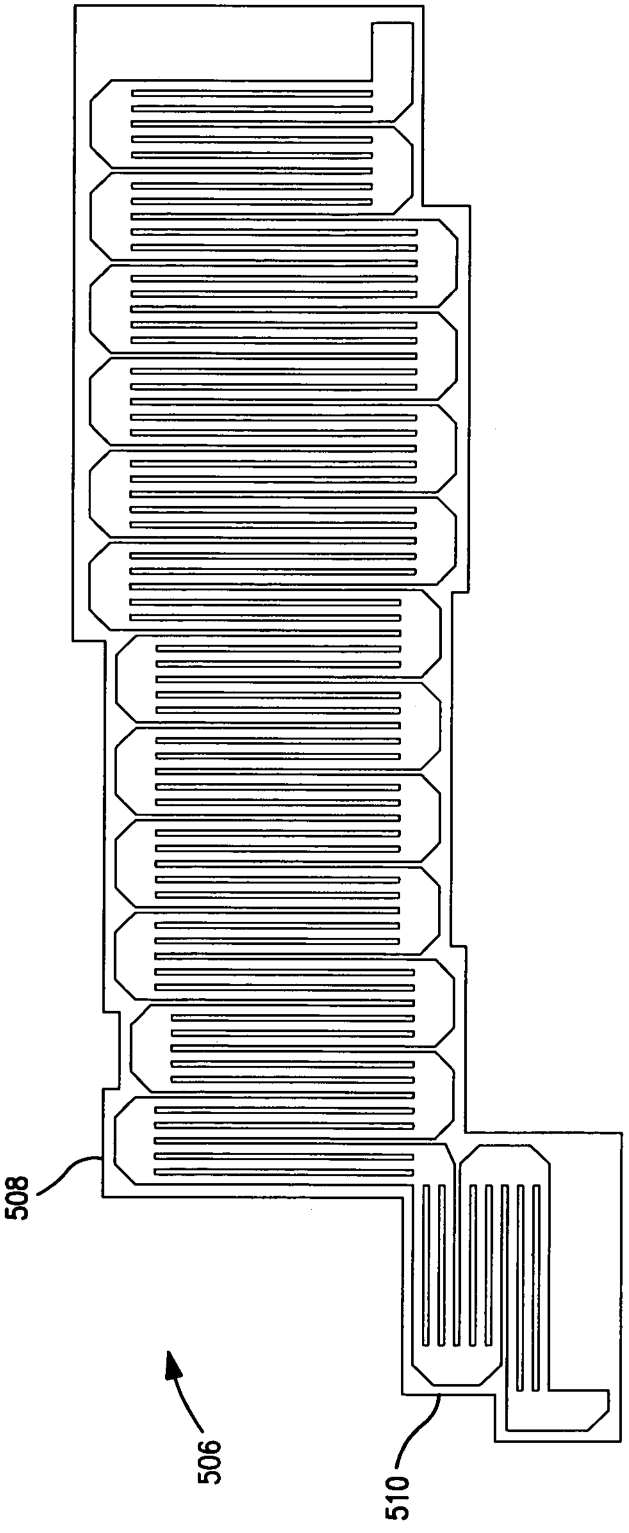
FIG. 10 is a schematic showing that the heater boundary can be modified to fit the available space on the substrate.
Figure 10B:
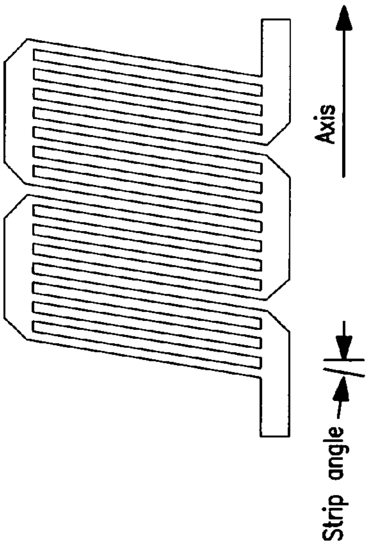
Figure 10C:
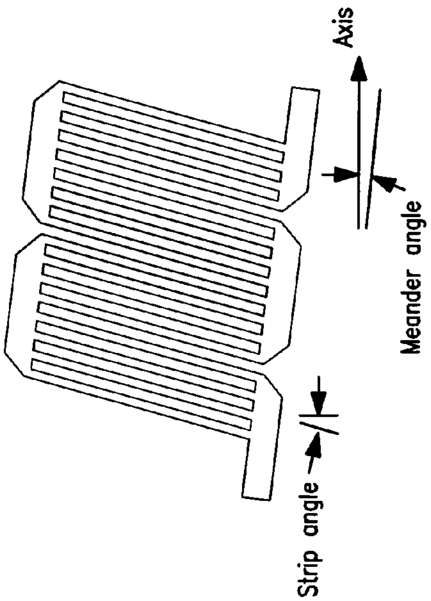
Figure 10D:
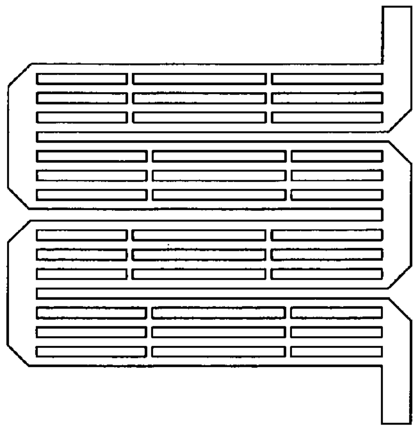

FIG. 10A is a variation 506 of the configuration shown in FIG. 9, according to which the heater groups can be arranged in an arbitrary shape to accommodate non-uniformity in the footprint available for providing heating on the substrate. The groups not only have differing lengths of strips, but the nodes need not fall on a straight line and the groups can be set at an angle to each other as shown at 508, 510. Thus, some of the groups of one heater can be arranged in one arbitrary direction on the substrate and other groups of the same heater can be arranged at an arbitrary angle relative to the one direction. As further exemplified in FIGS. 10B and C, a meander heater can have nodes that are parallel to the substrate axis with strips that are obliquely angled to the nodes or axis, or the nodes can be angled to the axis substrate axis and the strips are angled with respect to the nodes. FIG. 10D shows a feature used in transducers that can be incorporated into any of the meander heaters, wherein strip groups are electrically connected through shorting strips. This does not significantly modify the resistance of the meander, but it does make the meander more tolerant of defects.

Figure 11:
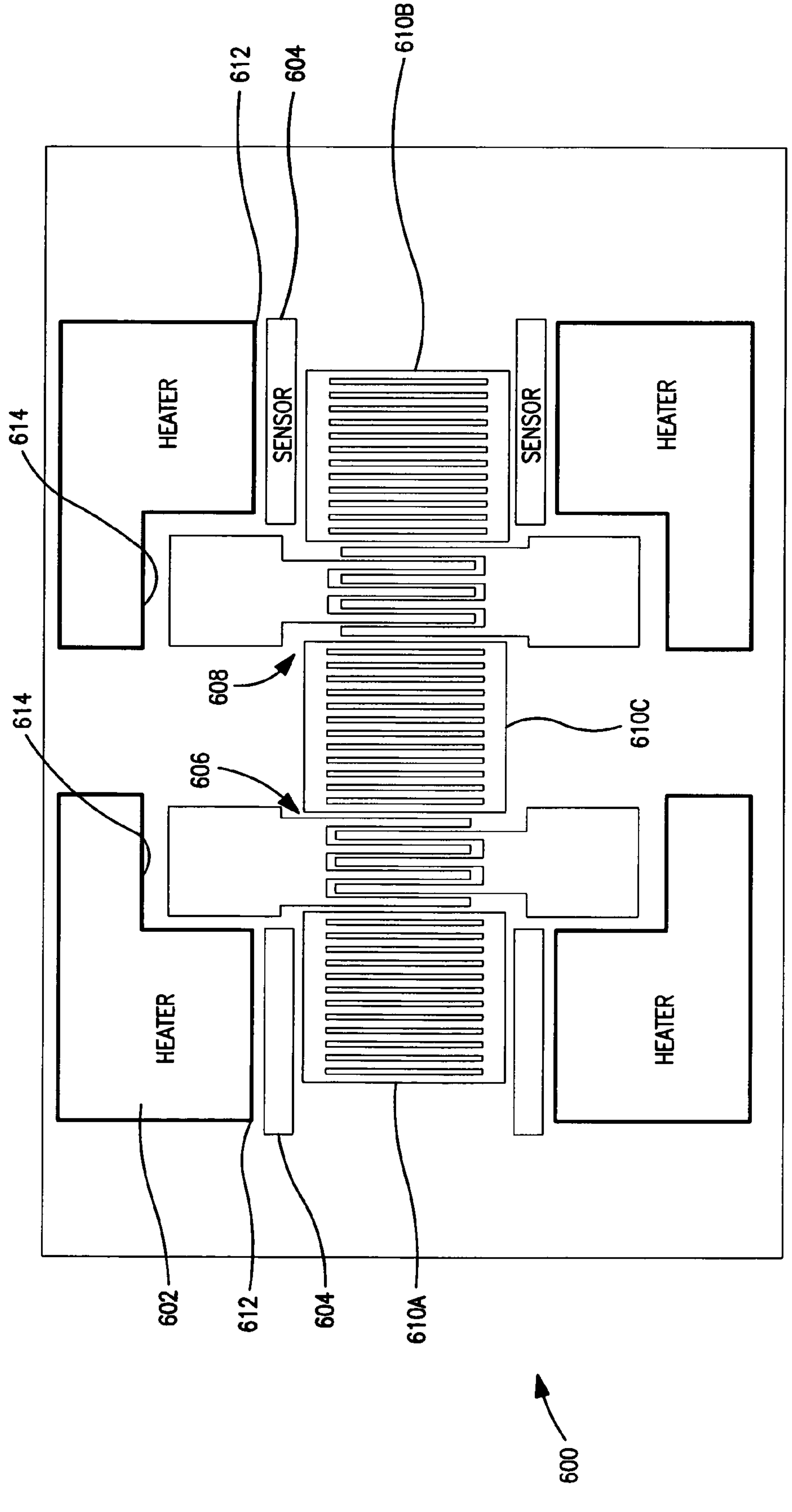
FIG. 11 is a schematic of a two-port SAW resonator with heaters and sensor.

FIG. 11 shows a two-port SAW resonator 600 with heaters 602 and temperature sensors 604. This device has a pair of spaced apart transducers 606 and 608, each having transducer buses, and three sets of grating, one 610 A on one side of the first transducer 606, another 6106 on the opposite side of the second transducer 608, and another 610C between the transducers. The heater elements 602 can be configured in an angled pattern to accommodate the additional number of transducer pads. Each heater has a main boundary 612 running parallel with the two outer gratings 610 A,B and a secondary boundary 614 adjacent to the transducer pads. In a general way, the heaters are provided at the four corners of the substrate and the sensors are provided between the main boundaries of the heater and the boundaries of the outer gratings.

As in the relationship between the one-port resonator with distinct sensors shown in FIG. 3 relative to the one-port resonator with temperature sensors integrated with the grating as shown in FIG. 4, the sensors of FIG. 11 could be integrated with the respective gratings.

Figure 12:
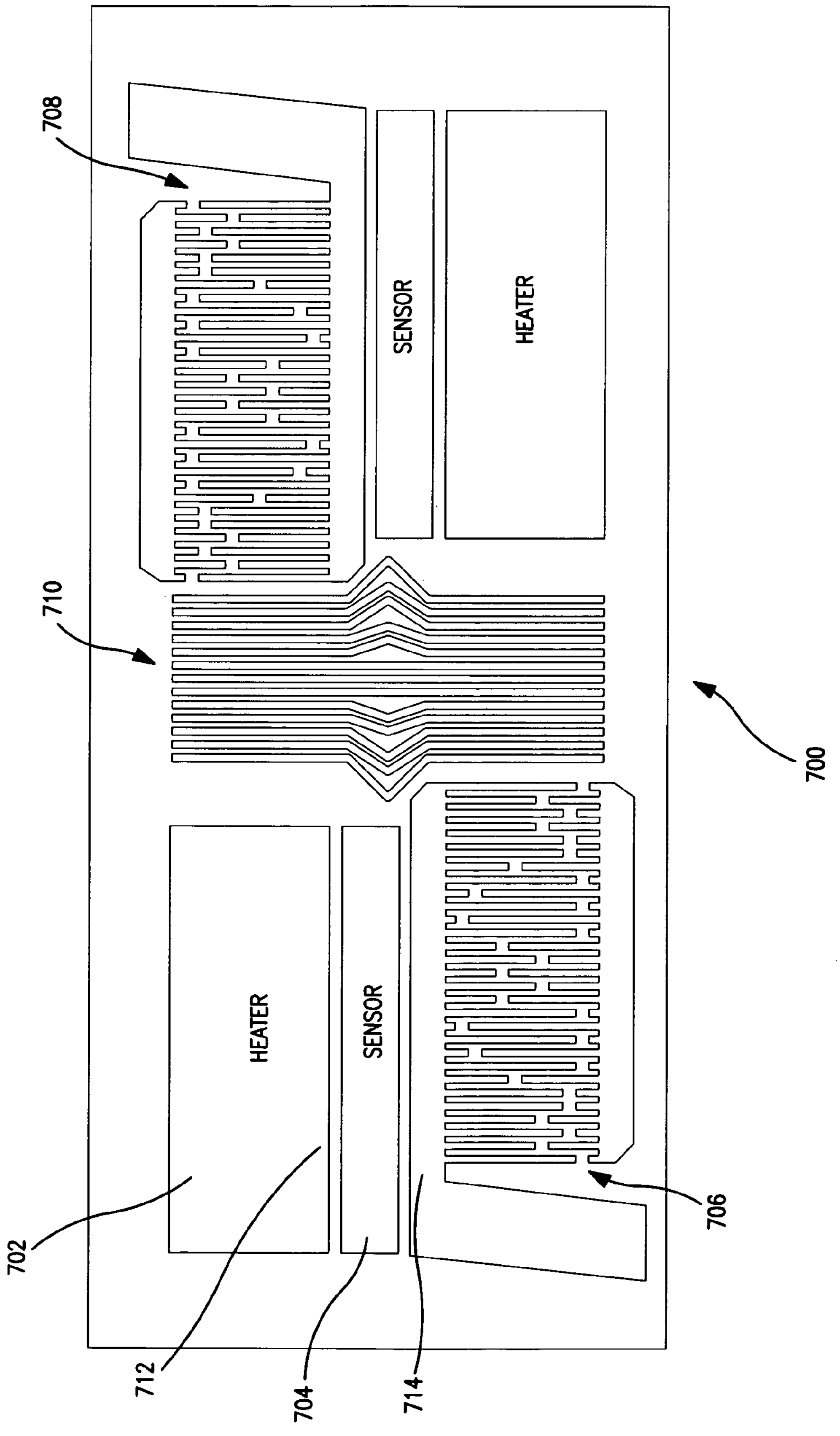
FIG. 12 is a schematic of a two-port MSC coupled to a SAW filter with heaters and sensor.

FIG. 12 shows a two-port multistrip coupler (MSC) with a SAW filter on the common substrate. This type of two-port SAW filter 700 also has monolithic heaters 702 and temperature sensors 704. This device has a pair of spaced apart transducers 706 and 708, each having transducer buses, and a set of non-connected metallic strips known as a multistrip coupler 710 between the transducers. Each heater has a main boundary 712 running parallel to the nearest bus bar 714 of a transducer 706 or 708 which may be separated by the sensor 704. In a general way, the heaters are provided at or near a boundary of the transducers and the MSC. The sensors are provided between a boundary of the heater and a boundary of a transducer. The sensors may be located anywhere on the working surface and not necessarily between a heater and a transducer. Electrical connections between the heaters and/or sensors and bond pads for the heaters/sensors are not shown in the figure.

FIG. 13 is to be considered in combination with FIGS. 1 and 2, as a schematic representation of the steps for monolithically forming the heater elements 116 and the transducers 106, 108 simultaneously, with the same material composition, using a photomask lift-off technique.

Figure 13A:
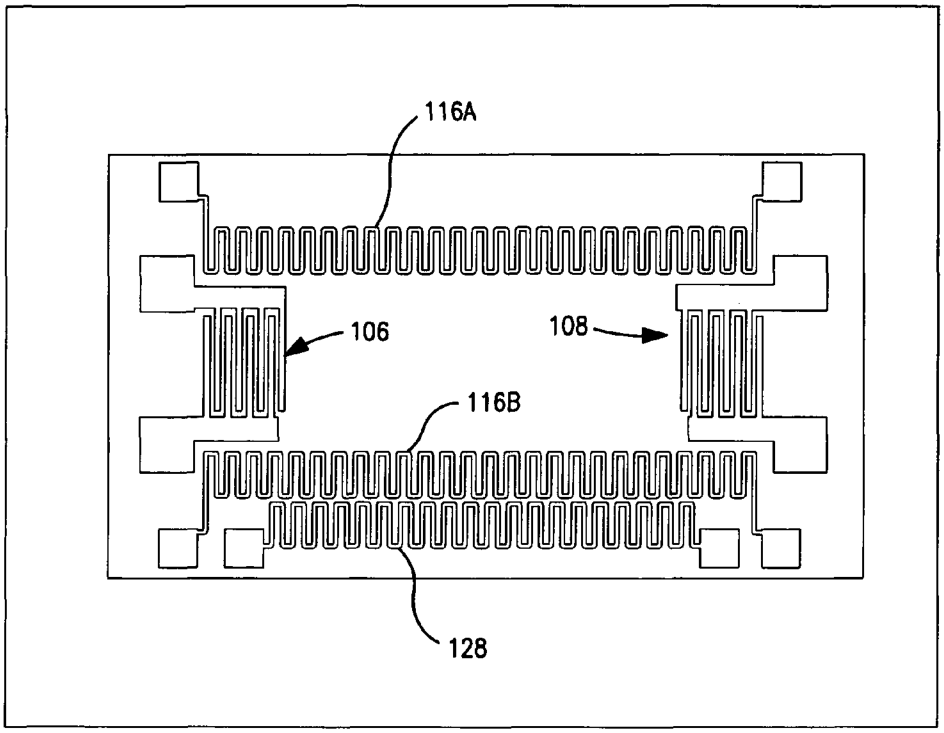
FIG. 13 is a schematic representation of the steps for monolithically forming the heater elements and the transducers simultaneously, with the same material composition.
Figure 13B:
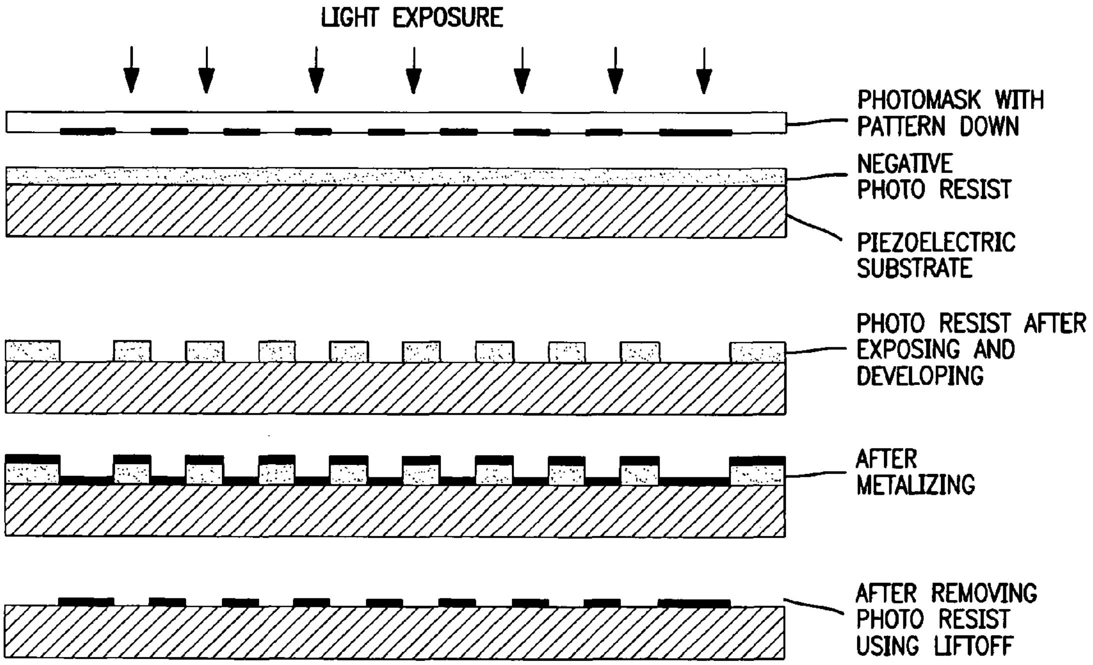

FIG. 13A shows these features as deposited on the substrate, whereas FIG. 13B shows the sequence of steps using a clear field mask liftoff technique. In this technique, a negative photo resist is applied on the entire surface of the piezoelectric substrate, and a photomask with pattern down is located over the photo resist. Radiation of the appropriate wavelength blanket exposes the photomask, thereby producing distinct regions of soluble and insoluble material in the photo resist. Upon development, the soluble regions are removed, leaving a pattern of substrate and hardened photo resist, as a precursor to the transducers, heaters, and sensor. The entire surface of the precursor is then metalized and, after removing the photoresist using conventional liftoff, the metal remaining directly on the surface of the substrate forms the monolithic transducers, heaters, and sensor.

Practitioners in this field can readily employ the alternative technique of using a dark field mask, with a positive photoresist. In either case, the foregoing process would be employed when all of the transducers, heaters, and sensors are to be monolithically formed with the same material composition.

FIG. 14 is a schematic representation of the steps for monolithically forming the transducers 106, 108 and the heater elements 116 and sensor element 128 in sequence, with different material compositions, using a photomask lift-off technique.

Figure 14A:
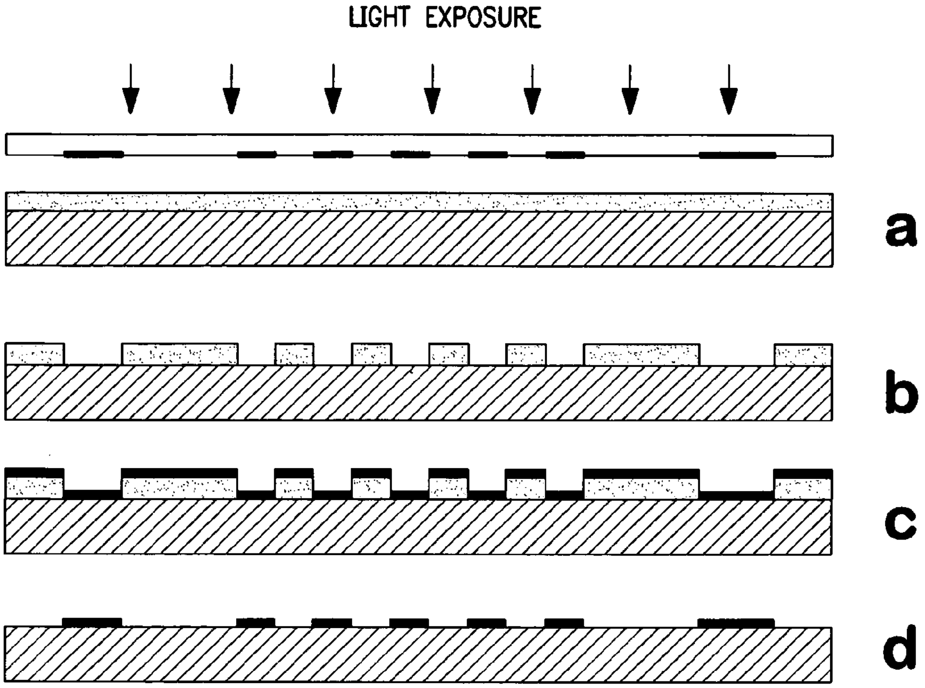
FIG. 14 is a schematic representation of the steps for monolithically forming the heater elements and the transducers with different material compositions.
Figure 14B:
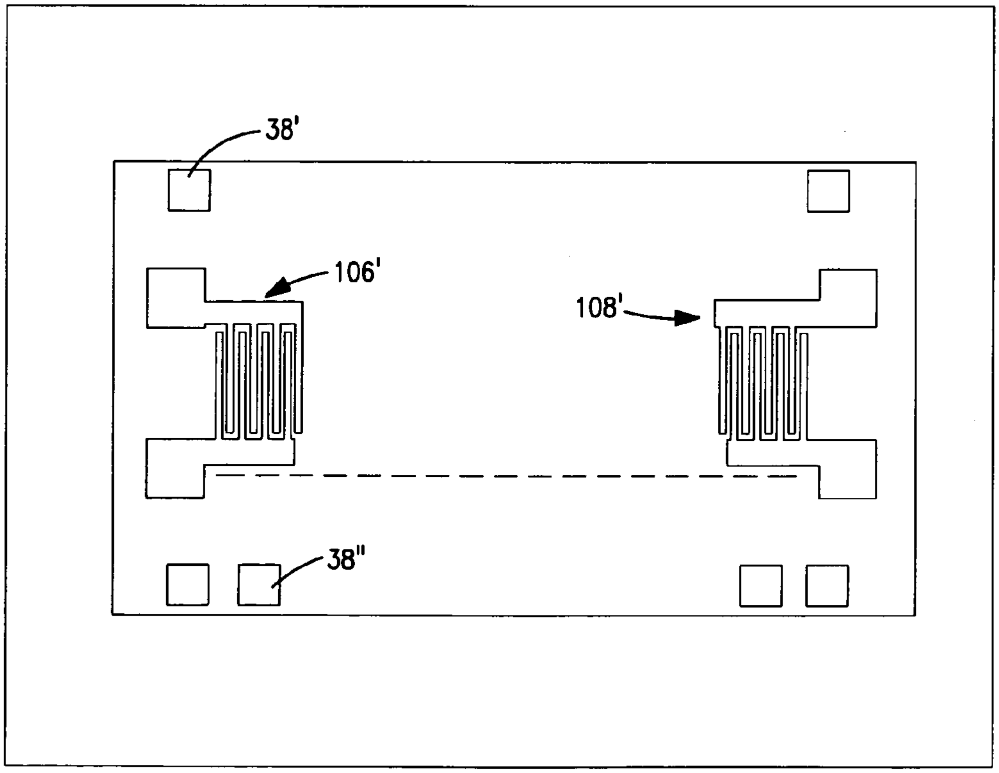
Figure 14C:
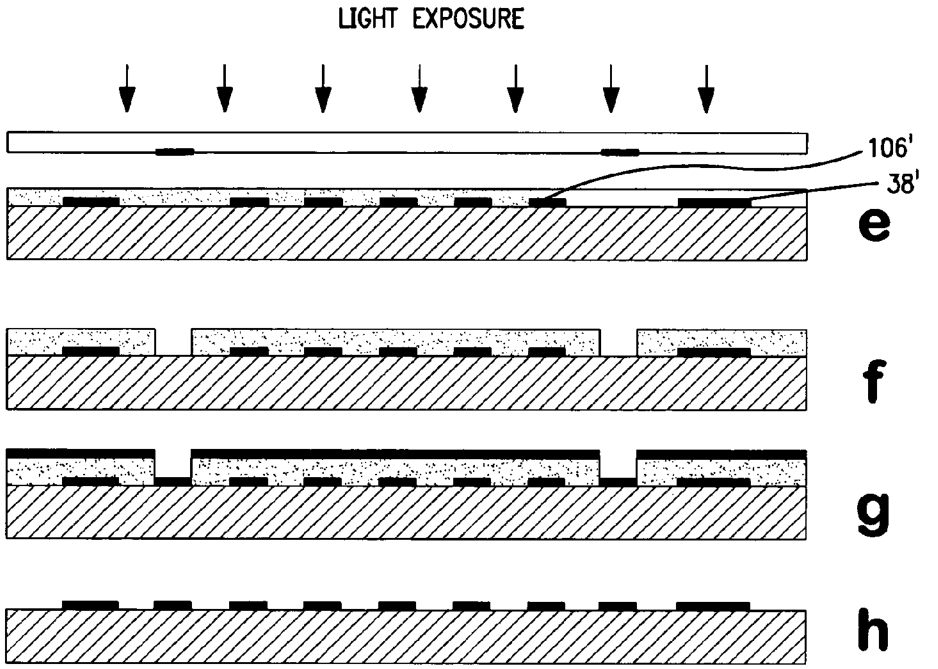
Figure 14D:
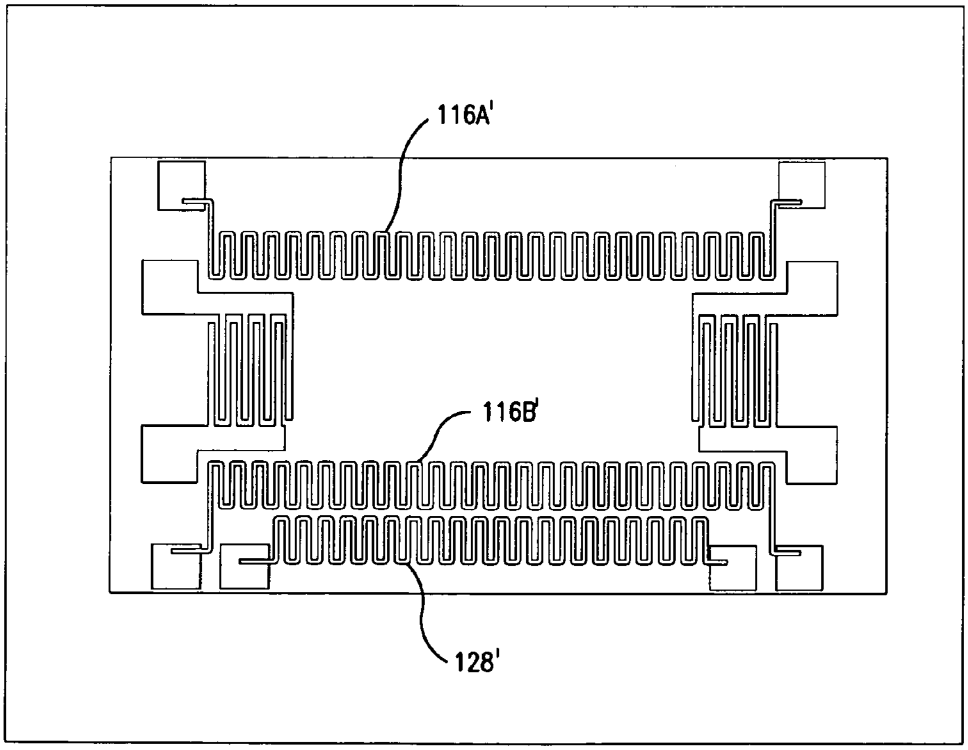

FIG. 14C at "e" shows that the substrate with the previously formed transducers 106' and bond pad 38' has a negative photo resist applied thereon and a photomask located thereover with a pattern for ultimately producing only the heater elements 116A' and 116B' as well as the sensor 128'. The photomask over the photo resist is subjected to light exposure, the photo resist is developed as at "f", the result is metalized as at "g", and the final form of the monolithically applied material is shown at "h", corresponding to FIG. 14D. In this embodiment, the metalizing step "g" applies a different metal to the substrate photo resist.

It should be appreciated that other monolithic lithographic fabrication techniques can be employed to implement the invention, using the principles described with respect to FIGS. 13 and 14. Photolithography may be performed with a maskless direct write system (e.g., ebeam or optical) or using a stepper (e.g., 4×, 5× or 10× stepper). Liftoff, dry etch, or wet etch processing may be used. In addition, a dielectric layer may be deposited on top of the substrate before or after metallization to improve the filter's temperature coefficient of frequency and/or delay (e.g., $SiO_2$ over $128yxLiNbO_3$) or for passivation (STW). The metal layers may be partially or fully buried in the substrate by first etching the substrate after photolithography (e.g., using a $CF_4$ reactive ion etch process with a quartz substrate). The metal layers may be raised above the substrate by first etching the substrate after metalization (e.g., for frequency trimming using a $CF_4$ reactive ion etch process with a quartz substrate).

Figure 15:
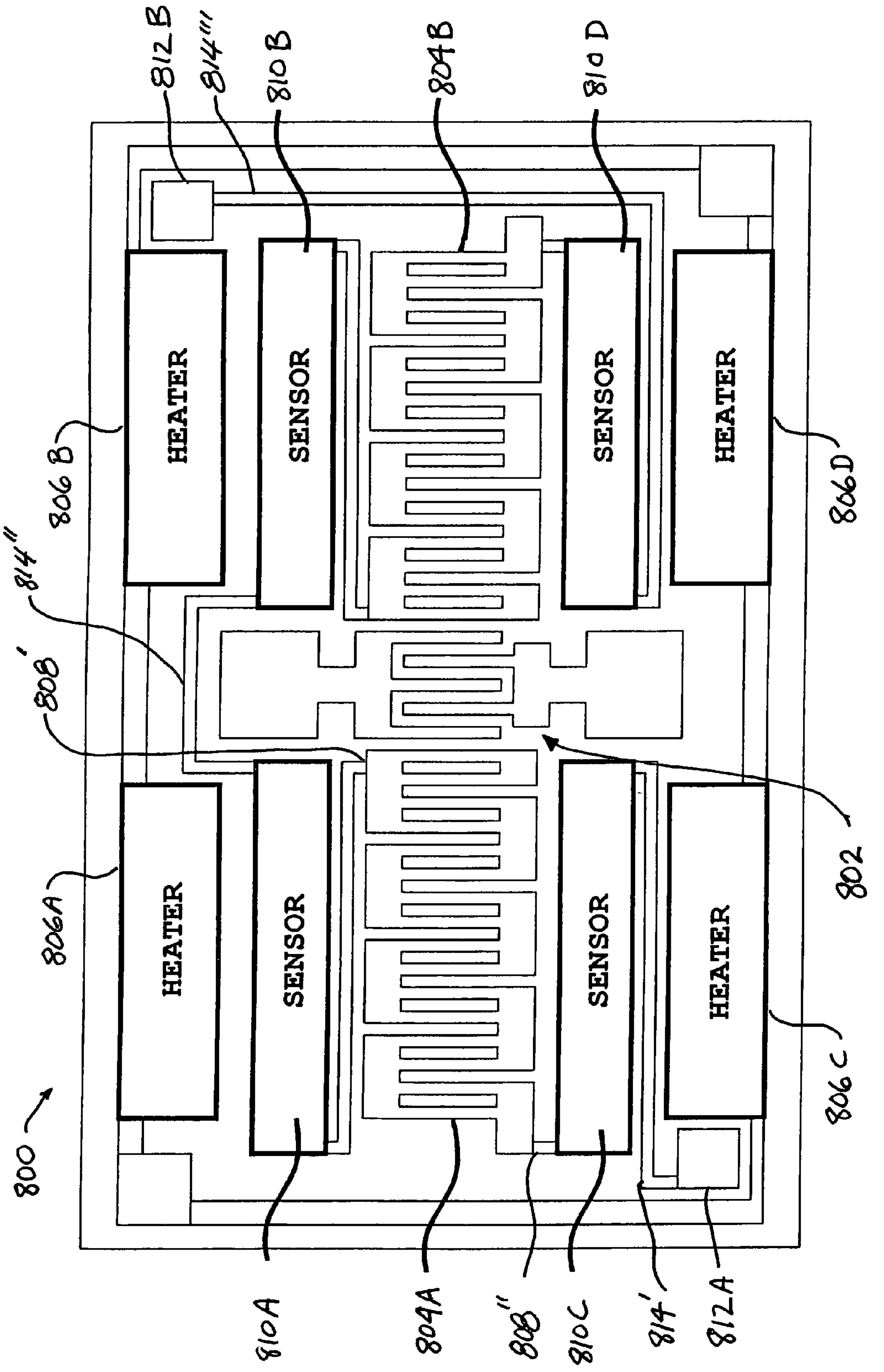
FIG. 15 is a schematic of an embodiment in which the temperature sensor is in part inherent in the grating and in part situated between the grating and the heating elements.

FIG. 15 shows an embodiment of a one port SAW resonator 800 with monolithic heater in which the temperature sensor is formed in part by monolithic sensor strips in the gratings and in part by monolithic sensor strips adjacent to the gratings. This embodiment can be considered as combining the sensors 302A and 302B shown in FIG. 4 with the sensors 212A, 212B, 212C, 212D shown in FIG. 3, all electrically connected in series to form a composite sensor with higher electrical resistance than can be obtained with either sensors 302 or 212 individually. This higher resistivity reduces the heating caused by the sensor. In a manner similar to the embodiment of FIG. 4, the monolithic gratings provide the dual functions of acoustic reflector for the resonator and a contribution to the temperature sensor.

With further reference to FIG. 15, the SAW resonator 800 has a central transducer 802 with left grating 804A and right grating 804B extending laterally from each side of the transducer. Each grating has an inner end adjacent to the transducer and an opposite outer end, and opposite sides that extend between the inner and outer ends. A heater element 806A, 806B, 806C, and 806D is respectively spaced from a side of a grating 804A, 804B. The grating is in the form of thin film metallic electrode strips connected in a grouped meander pattern to form a first partial temperature sensor. Corresponding second partial temperature sensors 810A, B, C and D are situated between each side of a grating and a heating element, respectively. The second partial sensors are likewise in the form of thin film metalic meander resistor electrode strips monolithically formed on the working surface. Each of the second partial temperature sensors 810 has one end electrically connected to one end of a grating and another end electrically connected to another second partial temperature sensor or to a bond pad for temperature controller. Although not all of the connections are labelled in FIG. 15, an electrical path from the inner end 808' of grating 804A extends to the outer end of sensor 810A, and another electrical path extends from the outer end 808" of grating 804A to sensor 810C. All of the first and second partial sensors are connected in electrical series, as is evident from the starting position of temperature sensor bond pad 812A for a temperature controller, connected to path segment 814' at one end of partial sensor 810C, through the partial sensor to inner end 808' of the grating 804A, to the outer end of partial sensor 810A. The inner end of partial sensor 810A is connected via path segment 814" to the inner end of partial sensor 810B, which in a similar manner as previously described, is connected to the inner end of grating 804B, which in turn has its outer end connected to partial sensor 810D. The inner end of partial sensor 810D is connected via path 814'" to the other bond pad 8128 of the pair of temperature controller bond pads.

It should be further appreciated that the modularity of the heater elements to provide flexibility in heater power and/or spatial distribution of heat is itself innovative and can be implemented independently of the preferred monolithic process (e.g., via a hybrid fabrication).

The invention claimed is:

1. A surface acoustic wave (SAW) device comprising:

a piezoelectric substrate having a working surface with an active zone capable of propagating an acoustic wave on said working surface;

at least one interdigital transducer on the working surface, having interdigital fingers aligned in the active zone for inducing or receiving surface acoustic waves in the active zone;

a meander strip heating element on the working surface outside the active zone;

a meander strip temperature sensor on the working surface outside the active zone;

wherein the at least one transducer, temperature sensor and heating element are monolithically formed on the substrate.

2. The SAW device of claim 1, wherein, the working surface is substantially rectilinear with opposite input and output ends and opposite sides;

one of said transducers is an input transducer adjacent the input end and another transducer is an output transducer adjacent the output end;

said active zone extends between the input and output transducers;

one of said meander strip heating element is situated on the working surface between the active zone and each side of the working surface; and one of said temperature sensor is located between the active zone and each side of the working surface.

3. The SAW device of claim 1, wherein each interdigital transducer includes a plurality of spaced apart fingers electrically connected to common buses on the working surface; and the buses and fingers have the same material composition as the heating element.

4. The SAW device of claim 1, wherein the meander strip heating element comprises a meander of thin film metallic resistor electrode strips.

5. The SAW device of claim 4, wherein the meander strip heating element comprises a meander of groups of at least two thin film metallic resistor electrode strips.

6. The SAW device of claim 4, wherein the meander strip heating element comprises a series of meander groups in which each group has a plurality of thin film metallic resistor electrode strips and not all groups have the same number of said strips.

7. The SAW device of claim 4, wherein the meander strip heating element comprises a series of meander groups in which each group has a plurality of thin film metallic resistor electrode strips of substantially equal length and at least two of said groups have strips of different lengths.

8. The SAW device of claim 7, wherein each of said meander groups is connected to an outer node and an inner node, with the inner nodes closer to the active zone than the outer nodes; and at least the outer nodes are non-uniformly spaced from the active zone.

9. The SAW device of claim 8, wherein some of the meander groups of said meander strip heating elements are arranged in one direction on the substrate and other of the meander groups of said said meander strip heating elements are arranged at an angle relative to said one direction.

10. The SAW device of claim 4, wherein the meander strip heating element comprises a series of meander groups in which each group has a plurality of thin film metallic resistor electrode strips connected to outer and inner nodes, and in each group the strips form an oblique angle with the nodes.

11. The SAW device of claim 4, wherein the meander strip heating element comprises a series of meander groups in which each group has a plurality of thin film metallic resistor electrode strips connected to outer and inner nodes, the active zone has a propagation axis, and in said series of meander groups of the meander strip heating element, the nodes of at least one group are angled relative to the propagation axis.

12. The SAW device of claim 1, wherein, the working surface is substantially rectilinear with opposite input and output ends and opposite sides;

one of said transducers is an input transducer adjacent the input end and another transducer is an output transducer adjacent the output end;

each transducer includes electrically conductive buses on the working surface;

said active zone extends between the input and output transducers;

one of said meander strip heating element is situated along each side margin of the substrate between the active zone and each side of the working surface;

each transducer and each heating element has a respective pair of contact bond pads; and the buses and bond pads are formed monolithically with and have the same material composition as the heating element.

13. The SAW device of claim 1, wherein the heating element comprises a meandering strip of a thin film metallic resistor electrode and the temperature sensor comprises a thin film metallic resistor electrode.

14. The SAW device of claim 1, wherein each interdigital transducer includes a bus bar on the working surface, and said bus bar is the same material composition as the heating element.

15. The SAW device of claim 1, wherein the active zone is capable of propagating an acoustic wave along a main axis on said working surface;

each interdigital transducer on the working surface is aligned for inducing or receiving surface acoustic waves in the active zone along the main axis of the working surface;

each transducer includes at least two electrically conductive buses on the working surface; and the transducer and heating element have the same material composition.

16. The SAW device of claim 1, configured as a resonator with an opposed two of said active zones, wherein one of said transducers is arranged on the working surface between said two opposed active zones; and at least one of said meander strip heating element is provided for each active zone and is located on the working surface.

17. The SAW device of claim 16, wherein each active zone includes a monolithic grating of thin film metallic resistor electrode strips having the dual functions of acoustic reflector and temperature sensor.

18. The SAW device of claim 1, wherein the meander strip heating element is a thin film metallic resistor electrode connected to a power source for supplying heat to affect a temperature of the substrate commensurate with the output of the power source;

the meander strip temperature sensor is a thin film metallic resistor electrode having an output commensurate with temperature of the substrate; and a temperature controller of the device is responsive to the output of the temperature sensor and is coupled to the power source for the heating element for controlling delivery of power to the heating element to maintain a target temperature of the substrate.

19. A surface acoustic wave (SAW) device comprising:

a piezoelectric substrate having a working surface with an active zone capable of propagating an acoustic wave on said working surface;

at least one interdigital transducer on the working surface, having interdigital fingers aligned in the active zone for inducing or receiving surface acoustic waves in the active zone;

at least one heating element on the working surface;

at least one temperature sensor on the working surface; wherein the at least one transducer, the at least one heating element, and the at least one temperature sensor are monolithically formed on the working surface; and each of the at least one heating element comprises a meander of thin film metallic resistor electrode strips and at least a portion of each of the at least one temperature sensor comprises a different meander of thin film metallic resistor electrode strips.

20. The SAW device of claim 19, wherein each monolithically formed temperature sensor is located between said active zone and said at least one heating element.

21. In a method for fabricating a surface acoustic wave device with a heating element, said device including a piezoelectric substrate having a working surface with an active zone capable of propagating an acoustic wave on said working surface; and at least one interdigital transducer on the working surface, aligned for inducing surface acoustic waves in the active zone; wherein the improvement comprises forming the heating element on the working surface, outside the active zone, monolithically with said at least one interdigital transducer; wherein the monolithic forming comprises a metalized photolithographic process; and includes the steps of applying a layer of imageable material to the working surface of the substrate; and imaging and developing the imageable material to simultaneously form a positive or negative surface pattern of layer material on the substrate corresponding to the transducer and heating element.

22. The method of claim 21, wherein said at least one interdigital transducer comprises an electrically conductive bus connected to a plurality of spaced apart interdigital fingers; and said bus is monolithically formed on the substrate simultaneously with the transducer and heating element.

23. The method of claim 21, wherein said at least one interdigital transducer and said heating element include bond pad contacts; and the bond pad contacts are formed monolithically with the transducer and heating element.

24. The method of claim 23, wherein each of said at least one heating element is formed as a grouped meander pattern of thin film metallic resistor electrodes and a distinct temperature sensor is monolithically formed adjacent a respective heating element as a different monolithic grouped meander pattern of thin film metallic resistor electrodes.

25. The method of claim 24, wherein each temperature sensor is formed between an active zone and a heating element.

26. The method of claim 21, including applying a layer of imageable material separately from the imageable material for the at least one interdigital transducer and the heating element; and imaging and developing all the imageable material to simultaneously form a positive or negative surface pattern of layer material on the substrate corresponding to the transducer, the temperature sensor, and heating element.

* * * * *